United States Patent
Cha et al.

(10) Patent No.: US 10,312,956 B2
(45) Date of Patent: Jun. 4, 2019

(54) MOBILE TERMINAL

(71) Applicant: LG ELECTRONICS INC., Seoul (KR)

(72) Inventors: Youngdo Cha, Seoul (KR); Ikhyun Jo, Seoul (KR); Jangwoo Hong, Seoul (KR); Junsuk Kim, Seoul (KR); Hyunsu Song, Seoul (KR); Sunglyong Cha, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/891,855

(22) Filed: Feb. 8, 2018

(65) Prior Publication Data

US 2018/0278284 A1  Sep. 27, 2018

Related U.S. Application Data

(60) Provisional application No. 62/477,409, filed on Mar. 27, 2017.

(30) Foreign Application Priority Data

Aug. 10, 2017 (KR) .......................... 10-2017-0101689

(51) Int. Cl.
*H04B 1/38* (2015.01)
*H05K 5/00* (2006.01)
(Continued)

(52) U.S. Cl.
CPC ................ *H04B 1/38* (2013.01); *H04M 1/18* (2013.01); *H05K 5/0095* (2013.01); *H04B 2001/3894* (2013.01)

(58) Field of Classification Search
CPC ... H04B 1/38; H04B 2001/3894; H04M 1/18; H05K 5/0095
(Continued)

(56) References Cited

U.S. PATENT DOCUMENTS 9,872,408 B2 * 1/2018 Choi ........................ H04M 1/18
9,948,343 B2 * 4/2018 Moon ................... H04B 1/3888
2013/0242481 A1 9/2013 Kim et al.

FOREIGN PATENT DOCUMENTS

CN 204731764 U 10/2015
KR 10-2016-0063677 A 6/2016
(Continued)

*Primary Examiner* — Lee Nguyen
(74) *Attorney, Agent, or Firm* — Birch, Stewart, Kolasch & Birch, LLP

(57) ABSTRACT

There is disclosed a mobile terminal comprising a display unit comprising a first flat area and a second flat area provided adjacent to at least predetermined portion of the first flat area; a front window arranged in front of the display unit and comprising a second flat area and a second curved area provided adjacent to at least predetermined portion of the second flat area; a frame arranged behind the display unit and comprising a third flat area with the same right-and-left width to the first flat area and a third curved area provided adjacent to at least predetermined portion of the third flat area; an adhesive member arranged between the first flat area and the third flat area and configured to bondingly couple the display unit and the frame to each other; and a waterproof member provided on an outer surface of the adhesive member and configured to close a space formed between the front window and the frame by forming a looped curve between an edge of the front window and an edge of the frame, wherein at least predetermined portion of each of the second and third curved areas is overlapped with the first curved area, and at least predetermined portion of the waterproof member is provided between an outer end of the second curved area and an outer end of the third curved area, and the waterproof member divides the space formed between the front window and the frame into a closed inner space and a closed outer space, and a back-and-forth gap between the front window and the frame in the closed inner
(Continued)

space is larger than a back-and-forth gap between the front window and the frame in the closed outer space.

9 Claims, 12 Drawing Sheets

(51) Int. Cl.
    *H04M 1/18*     (2006.01)
    *H04B 1/30*     (2006.01)

(58) Field of Classification Search
    USPC .......................................... 455/575.1–575.8
    See application file for complete search history.

(56) References Cited

FOREIGN PATENT DOCUMENTS

| | | |
|---|---|---|
| KR | 10-2018-0097106 A | 8/2016 |
| KR | 10-2017-0040082 A | 4/2017 |

\* cited by examiner

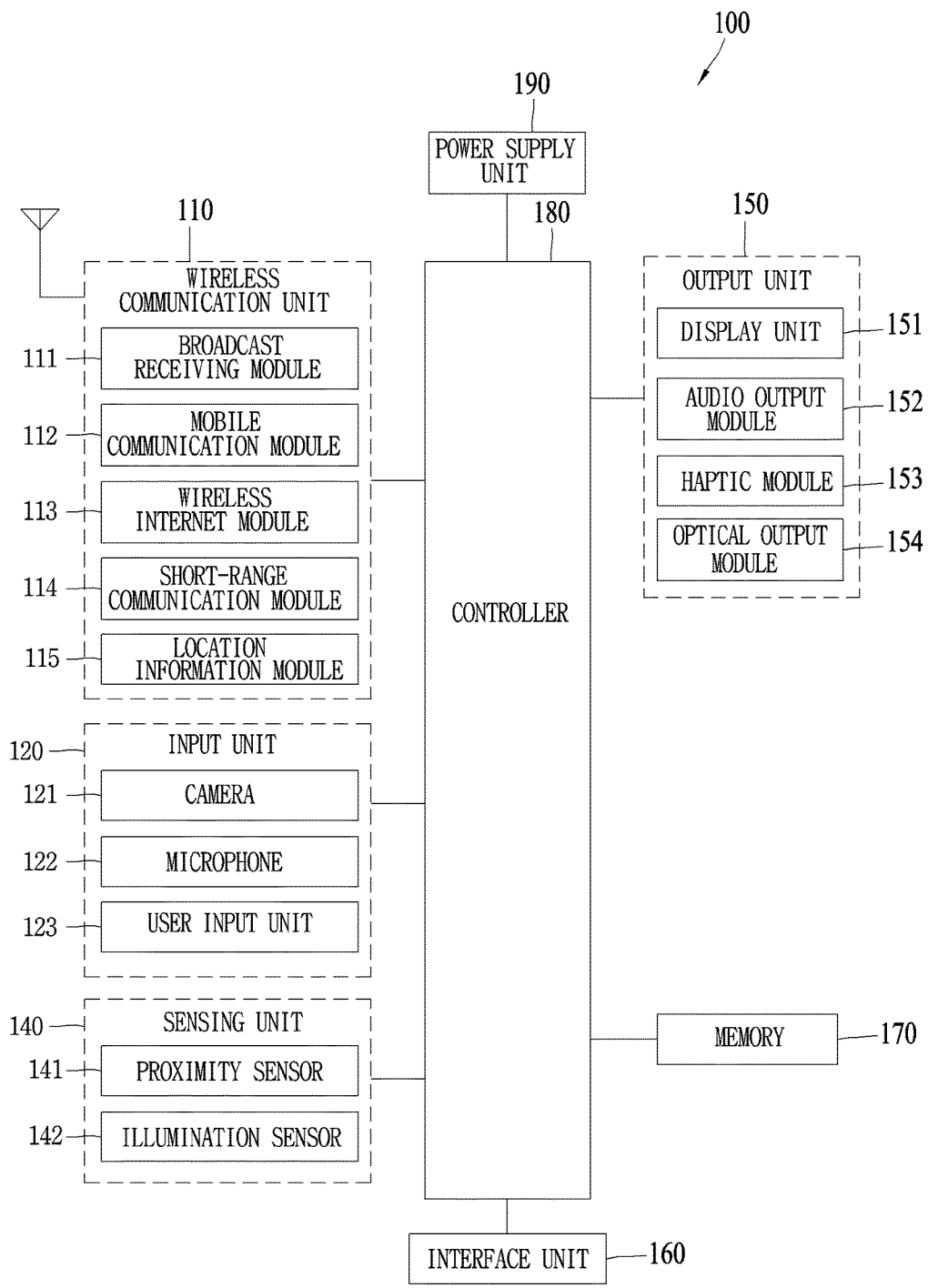

(a)

(b)

MOBILE TERMINAL

CROSS-REFERENCE TO RELATED APPLICATIONS

This non-provisional application claims the benefit under 35 U.S.C. § 119(a) to Patent Application No. 10-2017-0101689, filed in Republic of Korea on Aug. 10, 2017, and under 35 U.S.C. § 119(e) to U.S. Provisional Application No. 62/477,409 filed on Mar. 27, 2017, all of which are hereby expressly incorporated by reference into the present application.

BACKGROUND OF THE DISCLOSURE

Field of the Disclosure

Embodiments of the present disclosure relate to a mobile terminal which is capable of enhancing a waterproof function by coupling a front window to a frame in close contact.

Background of the Disclosure

In recent, diverse techniques about a waterproof structure of a mobile terminal are suggested. Such a mobile terminal is easy to carry in the hand so that it may be likely to be dropped in a space filled with water or other liquids. If permeating into the mobile terminal, water or other foreign substances might interfere with flow of electrical signals in the mobile terminal or cause a short circuit disadvantageously. In addition, internal components of the mobile terminal are fine micro-electronic components. Even when a small amount of water or other foreign substances permeate into the inner space, the internal components might cause corrosion or promote early deterioration.

Such a waterproof structure becomes problematic between a display unit and a frame, especially, a front window and the frame.

To solve the problem, techniques are recently suggested that a frame and a display or a front window of the mobile terminal is bonded to each other by using a waterproof tape.

To maximize an output area and minimize a bezel area of the display unit, such a waterproof tape is attached between a front window and a frame in upper and lower areas and between a display unit and a frame in right and left areas of the mobile terminal. Some of the waterproof tape is attached to a rear surface of the front window and some of the waterproof tape is attached to a rear surface of the display so that a curved area could be generated only to make it difficult to realize the perfect waterproof.

To solve that, some space is provided between the cut waterproof tapes and connection sealing is injected in the space. However, that method takes quite a long time to harden the sealing enough to deteriorate productivity. Also, the space might be sealed completely only to cause errors of failure in performing the waterproof function.

SUMMARY OF THE DISCLOSURE

Accordingly, an object of the present invention is to address the above-noted and other problems. Embodiments of the present disclosure provide a mobile terminal which is capable of enhancing a waterproof function by completely attaching a display and a frame or a front window and a frame to each other.

Embodiments of the present disclosure also provide a mobile terminal which minimizes a supply error rate in a fast manufacturing process.

Embodiments of the present disclosure may provide a mobile terminal including a mobile terminal comprising a display unit comprising a first flat area and a second flat area provided adjacent to at least predetermined portion of the first flat area; a front window arranged in front of the display unit and comprising a second flat area and a second curved area provided adjacent to at least predetermined portion of the second flat area; a frame arranged behind the display unit and comprising a third flat area with the same right-and-left width to the first flat area and a third curved area provided adjacent to at least predetermined portion of the third flat area; an adhesive member arranged between the first flat area and the third flat area and configured to bondingly couple the display unit and the frame to each other; and a waterproof member provided on an outer portion of the adhesive member and configured to form a closed space between the front window and the frame by forming a looped curve between an edge of the front window and an edge of the frame, wherein at least predetermined portion of each of the second and third curved areas is overlapped with the first curved area, and at least predetermined portion of the waterproof member is provided between an outer end of the second curved area and an outer end of the third curved area, and the waterproof member divides a space formed between the front window and the frame into the closed space and an outer space, and a back-and-forth gap between the front window and the frame of the closed space is larger than a back-and-forth gap between the front window and the frame of the outer space.

The third curved area may comprise a side wall projected from an outermost portion; and an application area provided in an inner portion of the side wall and having a step recessed backwards with respect to the side wall, and the waterproof member may be provided in an outer portion of the application area.

An edge of a rear surface of the front window may contact with an outer surface of the waterproof member.

The waterproof member may comprise a start portion bent from one portion of the looped curve; and an end portion bent at the other opposite portion of the looped curve and forming a boundary with the start portion, and the start portion and the end portion are provided to contact in parallel and forms the boundary.

The waterproof member may comprise a start portion bend from one portion of the looped curve; and an end portion bent at the other opposite portion of the looped curve and forming a boundary with the start portion, and the start portion and the end portion are provided to cross each other and may form the boundary.

The waterproof member may comprise a start portion bend from one portion of the looped curve; and an end portion bent at the other opposite portion of the looped curve and forming a boundary with the start portion, and the start portion and the end portion may be provided thinner than the other portions of the waterproof.

The start portion and the end portion may be bent toward the inside of the waterproof member.

According to the embodiments of the present disclosure, the examples of the mobile terminal in accordance with the present disclosure may have following effects.

The adhesive member need not perform the waterproof function and a freedom degree for the arrangement and shape of the adhesive member may rise.

Furthermore, there may be no cut-off area of the waterproof member and the waterproof function may be enhanced.

Still further, it does not take a long time to harden the waterproof member and the mobile terminal may be manufactured in a fast process.

Still further, the entire area of the waterproof member is uniformly hardened and the error rate of the mobile terminal may decrease.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings, which are given by illustration only, and thus are not limitative of the present invention, and wherein:

FIG. 1a is a block diagram of a mobile terminal in accordance with the present disclosure.

DESCRIPTION OF SPECIFIC EMBODIMENTS

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be connected with the other element or intervening elements may also be present. In contrast, when an element is referred to as being "directly connected with" another element, there are no intervening elements present.

A singular representation may include a plural representation unless it represents a definitely different meaning from the context. Terms such as "include" or "has" are used herein and should be understood that they are intended to indicate an existence of several components, functions or steps, disclosed in the specification, and it is also understood that greater or fewer components, functions, or steps may likewise be utilized.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, and the like.

Figure 1B:
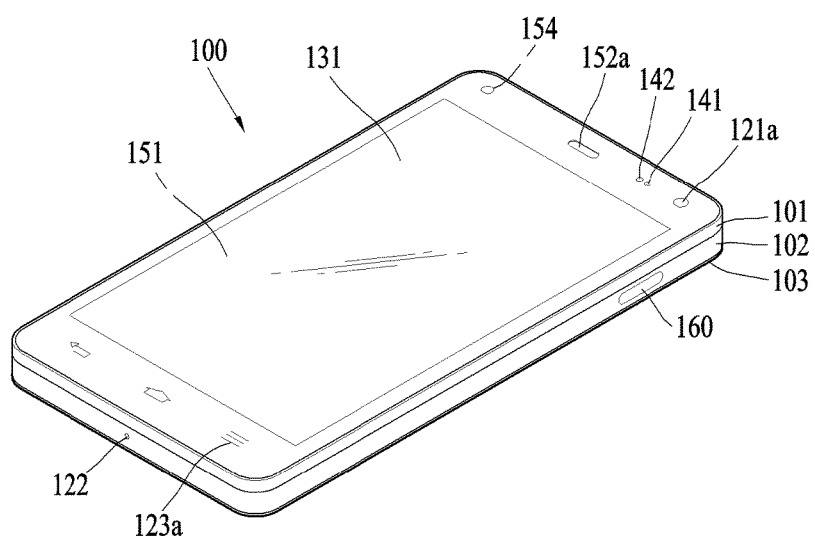
FIGS. 1b and 1c are conceptual views of one example of the mobile terminal, viewed from different directions.
Figure 1C:
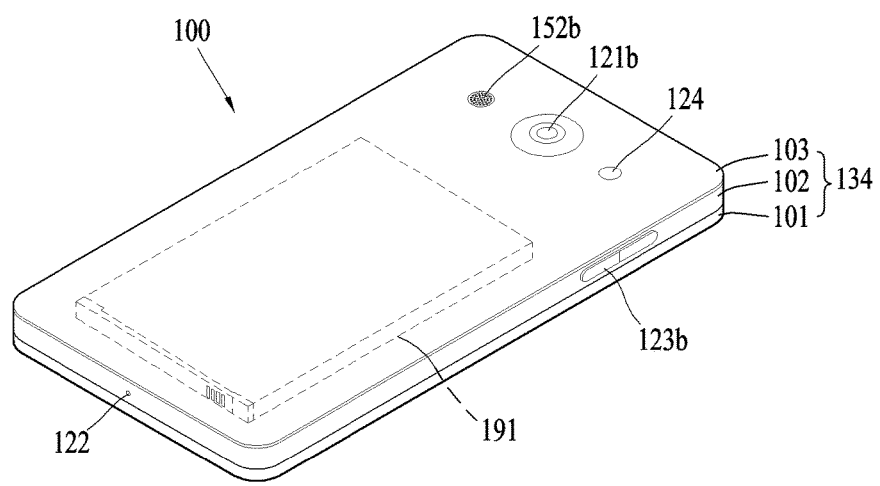

Reference is now made to FIGS. 1A-1C, where FIG. 1A is a block diagram of a mobile terminal in accordance with the present disclosure, and FIGS. 1B and 1C are conceptual views of one example of the mobile terminal, viewed from different directions.

The mobile terminal 100 is shown having components such as a wireless communication unit 110, an input unit 120, a sensing unit 140, an output unit 150, an interface unit 160, a memory 170, a controller 180, and a power supply unit 190. It is understood that implementing all of the illustrated components is not a requirement, and that greater or fewer components may alternatively be implemented.

Referring now to FIG. 1A, the mobile terminal 100 is shown having wireless communication unit 110 configured with several commonly implemented components.

The wireless communication unit 110 typically includes one or more modules which permit communications such as wireless communications between the mobile terminal 100 and a wireless communication system, communications between the mobile terminal 100 and another mobile terminal, communications between the mobile terminal 100 and an external server. Further, the wireless communication unit 110 typically includes one or more modules which connect the mobile terminal 100 to one or more networks. To facilitate such communications, the wireless communication unit 110 includes one or more of a broadcast receiving module 111, a mobile communication module 112, a wireless Internet module 113, a short-range communication module 114, and a location information module 115.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

The sensing unit 140 is typically implemented using one or more sensors configured to sense internal information of the mobile terminal, the surrounding environment of the mobile terminal, user information, and the like. For example, in FIG. 1A, the sensing unit 140 is shown having a proximity sensor 141 and an illumination sensor 142.

If desired, the sensing unit 140 may alternatively or additionally include other types of sensors or devices, such as a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The mobile terminal 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154.

The display unit 151 may have an inter-layered structure or an integrated structure with a touch sensor in order to facilitate a touch screen. The touch screen may provide an output interface between the mobile terminal 100 and a user, as well as function as the user input unit 123 which provides an input interface between the mobile terminal 100 and the user.

The interface unit 160 serves as an interface with various types of external devices that can be coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the controller 180 to perform an operation (or function) for the mobile terminal 100.

The controller 180 typically functions to control overall operation of the mobile terminal 100, in addition to the operations associated with the application programs. The controller 180 processes signals, data, informations and the like inputted or outputted through the above-mentioned components and/or runs application programs saved in the memory 170, thereby processing or providing a user with appropriate informations and/or functions.

The controller 180 may provide or process information or functions appropriate for a user by processing signals, data, information and the like, which are input or output by the various components depicted in FIG. 1A, or activating application programs stored in the memory 170. As one example, the controller 180 controls some or all of the components illustrated in FIGS. 1A-1C according to the execution of an application program that have been stored in the memory 170.

The power supply unit 190 can be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

At least one portion of the respective components mentioned in the foregoing description can cooperatively operate to embody operations, controls or controlling methods of the mobile terminal according to various embodiments of the present invention mentioned in the following description. Moreover, the operations, controls or controlling methods of the mobile terminal can be embodied in the mobile terminal by running at least one or more application programs saved in the memory 170.

Referring still to FIG. 1A, various components depicted in this figure will now be described in more detail. Regarding the wireless communication unit 110, the broadcast receiving module 111 is typically configured to receive a broadcast signal and/or broadcast associated information from an external broadcast managing entity via a broadcast channel. The broadcast channel may include a satellite channel, a terrestrial channel, or both. In some embodiments, two or more broadcast receiving modules 111 may be utilized to facilitate simultaneously receiving of two or more broadcast channels, or to support switching among broadcast channels.

The broadcast managing entity may be implemented using a server or system which generates and transmits a broadcast signal and/or broadcast associated information, or a server which receives a pre-generated broadcast signal and/or broadcast associated information, and sends such items to the mobile terminal. The broadcast signal may be implemented using any of a TV broadcast signal, a radio broadcast signal, a data broadcast signal, and combinations thereof, among others. The broadcast signal in some cases may further include a data broadcast signal combined with a TV or radio broadcast signal.

The broadcast signal may be encoded according to any of a variety of technical standards or broadcasting methods (for example, International Organization for Standardization (ISO), International Electrotechnical Commission (IEC), Digital Video Broadcast (DVB), Advanced Television Systems Committee (ATSC), and the like) for transmission and reception of digital broadcast signals. The broadcast receiving module 111 can receive the digital broadcast signals using a method appropriate for the transmission method utilized.

Examples of broadcast associated information may include information associated with a broadcast channel, a broadcast program, a broadcast event, a broadcast service provider, or the like. The broadcast associated information may also be provided via a mobile communication network, and in this case, received by the mobile communication module 112.

The broadcast associated information may be implemented in various formats. For instance, broadcast associated information may include an Electronic Program Guide (EPG) of Digital Multimedia Broadcasting (DMB), an Electronic Service Guide (ESG) of Digital Video Broadcast-Handheld (DVB-H), and the like. Broadcast signals and/or broadcast associated information received via the broadcast receiving module 111 may be stored in a suitable device, such as a memory 170.

The mobile communication module 112 can transmit and/or receive wireless signals to and from one or more network entities. Typical examples of a network entity include a base station, an external mobile terminal, a server, and the like. Such network entities form part of a mobile communication network, which is constructed according to technical standards or communication methods for mobile communications (for example, Global System for Mobile Communication (GSM), Code Division Multi Access (CDMA), CDMA2000 (Code Division Multi Access 2000), EV-DO (Enhanced Voice-Data Optimized or Enhanced Voice-Data Only), Wideband CDMA (WCDMA), High Speed Downlink Packet access (HSDPA), HSUPA (High Speed Uplink Packet Access), Long Term Evolution (LTE), LTE-A (Long Term Evolution-Advanced), and the like). Examples of wireless signals transmitted and/or received via the mobile communication module 112 include audio call signals, video (telephony) call signals, or various formats of data to support communication of text and multimedia messages.

The wireless Internet module 113 is configured to facilitate wireless Internet access. This module may be internally or externally coupled to the mobile terminal 100. The wireless Internet module 113 may transmit and/or receive wireless signals via communication networks according to wireless Internet technologies.

Examples of such wireless Internet access include Wireless LAN (WLAN), Wireless Fidelity (Wi-Fi), Wi-Fi Direct, Digital Living Network Alliance (DLNA), Wireless Broadband (WiBro), Worldwide Interoperability for Microwave Access (WiMAX), High Speed Downlink Packet Access (HSDPA), HSUPA (High Speed Uplink Packet Access), Long Term Evolution (LTE), LTE-A (Long Term Evolution-Advanced), and the like. The wireless Internet module 113 may transmit/receive data according to one or more of such wireless Internet technologies, and other Internet technologies as well.

In some embodiments, when the wireless Internet access is implemented according to, for example, WiBro, HSDPA, HSUPA, GSM, CDMA, WCDMA, LTE, LTE-A and the like, as part of a mobile communication network, the wireless Internet module 113 performs such wireless Internet access. As such, the Internet module 113 may cooperate with, or function as, the mobile communication module 112.

The short-range communication module 114 is configured to facilitate short-range communications. Suitable technologies for implementing such short-range communications include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, Wireless USB (Wireless Universal Serial Bus), and the like. The short-range communication module 114 in general supports wireless communications between the mobile terminal 100 and a wireless communication system, communications between the mobile terminal 100 and another mobile terminal 100, or communications between the mobile terminal and a network where another mobile terminal 100 (or an external server) is located, via wireless area networks. One example of the wireless area networks is a wireless personal area networks.

In some embodiments, another mobile terminal (which may be configured similarly to mobile terminal 100) may be a wearable device, for example, a smart watch, a smart glass or a head mounted display (HIVID), which is able to exchange data with the mobile terminal 100 (or otherwise cooperate with the mobile terminal 100). The short-range communication module 114 may sense or recognize the wearable device, and permit communication between the wearable device and the mobile terminal 100. In addition, when the sensed wearable device is a device which is authenticated to communicate with the mobile terminal 100, the controller 180, for example, may cause transmission of data processed in the mobile terminal 100 to the wearable device via the short-range communication module 114. Hence, a user of the wearable device may use the data processed in the mobile terminal 100 on the wearable device. For example, when a call is received in the mobile terminal 100, the user may answer the call using the wearable device. Also, when a message is received in the mobile terminal 100, the user can check the received message using the wearable device.

The location information module 115 is generally configured to detect, calculate, derive or otherwise identify a position of the mobile terminal. As an example, the location information module 115 includes a Global Position System (GPS) module, a Wi-Fi module, or both. If desired, the location information module 115 may alternatively or additionally function with any of the other modules of the wireless communication unit 110 to obtain data related to the position of the mobile terminal.

As one example, when the mobile terminal uses a GPS module, a position of the mobile terminal may be acquired using a signal sent from a GPS satellite. As another example, when the mobile terminal uses the Wi-Fi module, a position of the mobile terminal can be acquired based on information related to a wireless access point (AP) which transmits or receives a wireless signal to or from the Wi-Fi module.

The input unit 120 may be configured to permit various types of input to the mobile terminal 120. Examples of such input include audio, image, video, data, and user input. Image and video input is often obtained using one or more cameras 121. Such cameras 121 may process image frames of still pictures or video obtained by image sensors in a video or image capture mode. The processed image frames can be displayed on the display unit 151 or stored in memory 170. In some cases, the cameras 121 may be arranged in a matrix configuration to permit a plurality of images having various angles or focal points to be input to the mobile terminal 100. As another example, the cameras 121 may be located in a stereoscopic arrangement to acquire left and right images for implementing a stereoscopic image.

The microphone 122 is generally implemented to permit audio input to the mobile terminal 100. The audio input can be processed in various manners according to a function being executed in the mobile terminal 100. If desired, the microphone 122 may include assorted noise removing algorithms to remove unwanted noise generated in the course of receiving the external audio.

The user input unit 123 is a component that permits input by a user. Such user input may enable the controller 180 to control operation of the mobile terminal 100. The user input unit 123 may include one or more of a mechanical input element (for example, a key, a button located on a front and/or rear surface or a side surface of the mobile terminal 100, a dome switch, a jog wheel, a jog switch, and the like), or a touch-sensitive input, among others. As one example, the touch-sensitive input may be a virtual key or a soft key, which is displayed on a touch screen through software processing, or a touch key which is located on the mobile terminal at a location that is other than the touch screen. On the other hand, the virtual key or the visual key may be displayed on the touch screen in various shapes, for example, graphic, text, icon, video, or a combination thereof.

The sensing unit 140 is generally configured to sense one or more of internal information of the mobile terminal, surrounding environment information of the mobile terminal, user information, or the like. The controller 180 generally cooperates with the sending unit 140 to control operation of the mobile terminal 100 or execute data processing, a function or an operation associated with an application program installed in the mobile terminal based on the sensing provided by the sensing unit 140. The sensing unit 140 may be implemented using any of a variety of sensors, some of which will now be described in more detail.

The proximity sensor 141 may include a sensor to sense presence or absence of an object approaching a surface, or an object located near a surface, by using an electromagnetic field, infrared rays, or the like without a mechanical contact. The proximity sensor 141 may be arranged at an inner region of the mobile terminal covered by the touch screen, or near the touch screen.

The proximity sensor 141, for example, may include any of a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and the like. When the touch screen is implemented as a capacitance type, the proximity sensor 141 can sense proximity of a pointer relative to the touch screen by changes of an electromagnetic field, which is responsive to an approach of an object with conductivity. In this case, the touch screen (touch sensor) may also be categorized as a proximity sensor.

The term "proximity touch" will often be referred to herein to denote the scenario in which a pointer is positioned to be proximate to the touch screen without contacting the touch screen. The term "contact touch" will often be referred to herein to denote the scenario in which a pointer makes physical contact with the touch screen. For the position corresponding to the proximity touch of the pointer relative to the touch screen, such position will correspond to a position where the pointer is perpendicular to the touch screen. The proximity sensor 141 may sense proximity touch, and proximity touch patterns (for example, distance, direction, speed, time, position, moving status, and the like).

In general, controller 180 processes data corresponding to proximity touches and proximity touch patterns sensed by the proximity sensor 141, and cause output of visual information on the touch screen. In addition, the controller 180 can control the mobile terminal 100 to execute different operations or process different data according to whether a touch with respect to a point on the touch screen is either a proximity touch or a contact touch.

A touch sensor can sense a touch applied to the touch screen, such as display unit 151, using any of a variety of touch methods. Examples of such touch methods include a resistive type, a capacitive type, an infrared type, and a magnetic field type, among others.

As one example, the touch sensor may be configured to convert changes of pressure applied to a specific part of the display unit 151, or convert capacitance occurring at a specific part of the display unit 151, into electric input signals. The touch sensor may also be configured to sense not only a touched position and a touched area, but also touch pressure and/or touch capacitance. A touch object is generally used to apply a touch input to the touch sensor. Examples of typical touch objects include a finger, a touch pen, a stylus pen, a pointer, or the like.

When a touch input is sensed by a touch sensor, corresponding signals may be transmitted to a touch controller. The touch controller may process the received signals, and then transmit corresponding data to the controller 180. Accordingly, the controller 180 may sense which region of the display unit 151 has been touched. Here, the touch controller may be a component separate from the controller 180, the controller 180, and combinations thereof.

In some embodiments, the controller 180 may execute the same or different controls according to a type of touch object that touches the touch screen or a touch key provided in addition to the touch screen. Whether to execute the same or different control according to the object which provides a touch input may be decided based on a current operating state of the mobile terminal 100 or a currently executed application program, for example.

The touch sensor and the proximity sensor may be implemented individually, or in combination, to sense various types of touches. Such touches includes a short (or tap) touch, a long touch, a multi-touch, a drag touch, a flick touch, a pinch-in touch, a pinch-out touch, a swipe touch, a hovering touch, and the like.

If desired, an ultrasonic sensor may be implemented to recognize position information relating to a touch object using ultrasonic waves. The controller 180, for example, may calculate a position of a wave generation source based on information sensed by an illumination sensor and a plurality of ultrasonic sensors. Since light is much faster than ultrasonic waves, the time for which the light reaches the optical sensor is much shorter than the time for which the ultrasonic wave reaches the ultrasonic sensor. The position of the wave generation source may be calculated using this fact. For instance, the position of the wave generation source may be calculated using the time difference from the time that the ultrasonic wave reaches the sensor based on the light as a reference signal.

The camera 121 typically includes at least one a camera sensor (CCD, CMOS etc.), a photo sensor (or image sensors), and a laser sensor.

Implementing the camera 121 with a laser sensor may allow detection of a touch of a physical object with respect to a 3D stereoscopic image. The photo sensor may be laminated on, or overlapped with, the display device. The photo sensor may be configured to scan movement of the physical object in proximity to the touch screen. In more detail, the photo sensor may include photo diodes and transistors at rows and columns to scan content received at the photo sensor using an electrical signal which changes according to the quantity of applied light. Namely, the photo sensor may calculate the coordinates of the physical object according to variation of light to thus obtain position information of the physical object.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

In some embodiments, the display unit 151 may be implemented as a stereoscopic display unit for displaying stereoscopic images. A typical stereoscopic display unit may employ a stereoscopic display scheme such as a stereoscopic scheme (a glass scheme), an auto-stereoscopic scheme (glassless scheme), a projection scheme (holographic scheme), or the like.

In general, a 3D stereoscopic image may include a left image (e.g., a left eye image) and a right image (e.g., a right eye image). According to how left and right images are combined into a 3D stereoscopic image, a 3D stereoscopic imaging method can be divided into a top-down method in which left and right images are located up and down in a frame, an L-to-R (left-to-right or side by side) method in which left and right images are located left and right in a frame, a checker board method in which fragments of left and right images are located in a tile form, an interlaced method in which left and right images are alternately located by columns or rows, and a time sequential (or frame by frame) method in which left and right images are alternately displayed on a time basis.

Also, as for a 3D thumbnail image, a left image thumbnail and a right image thumbnail can be generated from a left image and a right image of an original image frame, respectively, and then combined to generate a single 3D thumbnail image. In general, the term "thumbnail" may be used to refer to a reduced image or a reduced still image. A generated left image thumbnail and right image thumbnail may be displayed with a horizontal distance difference there between by a depth corresponding to the disparity between the left image and the right image on the screen, thereby providing a stereoscopic space sense.

A left image and a right image required for implementing a 3D stereoscopic image may be displayed on the stereoscopic display unit using a stereoscopic processing unit. The stereoscopic processing unit can receive the 3D image and extract the left image and the right image, or can receive the 2D image and change it into a left image and a right image.

The audio output module 152 is generally configured to output audio data. Such audio data may be obtained from any of a number of different sources, such that the audio data may be received from the wireless communication unit 110 or may have been stored in the memory 170. The audio data may be output during modes such as a signal reception mode, a call mode, a record mode, a voice recognition mode, a broadcast reception mode, and the like. The audio output module 152 can provide audible output related to a particular function (e.g., a call signal reception sound, a message reception sound, etc.) performed by the mobile terminal 100. The audio output module 152 may also be implemented as a receiver, a speaker, a buzzer, or the like.

A haptic module 153 can be configured to generate various tactile effects that a user feels, perceive, or otherwise experience. A typical example of a tactile effect generated by the haptic module 153 is vibration. The strength, pattern and the like of the vibration generated by the haptic module 153 can be controlled by user selection or setting by the controller. For example, the haptic module 153 may output different vibrations in a combining manner or a sequential manner.

Besides vibration, the haptic module 153 can generate various other tactile effects, including an effect by stimulation such as a pin arrangement vertically moving to contact skin, a spray force or suction force of air through a jet orifice or a suction opening, a touch to the skin, a contact of an electrode, electrostatic force, an effect by reproducing the sense of cold and warmth using an element that can absorb or generate heat, and the like.

The haptic module 153 can also be implemented to allow the user to feel a tactile effect through a muscle sensation such as the user's fingers or arm, as well as transferring the tactile effect through direct contact. Two or more haptic modules 153 may be provided according to the particular configuration of the mobile terminal 100.

An optical output module 154 can output a signal for indicating an event generation using light of a light source. Examples of events generated in the mobile terminal 100 may include message reception, call signal reception, a missed call, an alarm, a schedule notice, an email reception, information reception through an application, and the like.

A signal output by the optical output module 154 may be implemented in such a manner that the mobile terminal emits monochromatic light or light with a plurality of colors. The signal output may be terminated as the mobile terminal senses that a user has checked the generated event, for example.

The interface unit 160 serves as an interface for external devices to be connected with the mobile terminal 100. For example, the interface unit 160 can receive data transmitted from an external device, receive power to transfer to elements and components within the mobile terminal 100, or transmit internal data of the mobile terminal 100 to such external device. The interface unit 160 may include wired or wireless headset ports, external power supply ports, wired or wireless data ports, memory card ports, ports for connecting a device having an identification module, audio input/output (I/O) ports, video I/O ports, earphone ports, or the like.

The identification module may be a chip that stores various information for authenticating authority of using the mobile terminal 100 and may include a user identity module (UIM), a subscriber identity module (SIM), a universal subscriber identity module (USIM), and the like. In addition, the device having the identification module (also referred to herein as an "identifying device") may take the form of a smart card. Accordingly, the identifying device can be connected with the terminal 100 via the interface unit 160.

When the mobile terminal 100 is connected with an external cradle, the interface unit 160 can serve as a passage to allow power from the cradle to be supplied to the mobile terminal 100 or may serve as a passage to allow various command signals input by the user from the cradle to be transferred to the mobile terminal there through. Various command signals or power input from the cradle may operate as signals for recognizing that the mobile terminal is properly mounted on the cradle.

The memory 170 can store programs to support operations of the controller 180 and store input/output data (for example, phonebook, messages, still images, videos, etc.). The memory 170 may store data related to various patterns of vibrations and audio which are output in response to touch inputs on the touch screen.

The memory 170 may include one or more types of storage mediums including a Flash memory, a hard disk, a solid state disk, a silicon disk, a multimedia card micro type, a card-type memory (e.g., SD or DX memory, etc), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, an optical disk, and the like. The mobile terminal 100 may also be operated in relation to a network storage device that performs the storage function of the memory 170 over a network, such as the Internet.

The controller 180 may typically control the general operations of the mobile terminal 100. For example, the controller 180 may set or release a lock state for restricting a user from inputting a control command with respect to applications when a status of the mobile terminal meets a preset condition.

The controller 180 can also perform the controlling and processing associated with voice calls, data communications, video calls, and the like, or perform pattern recognition processing to recognize a handwriting input or a picture drawing input performed on the touch screen as characters or images, respectively. In addition, the controller 180 can control one or a combination of those components in order to implement various exemplary embodiments disclosed herein.

The power supply unit 190 receives external power or provide internal power and supply the appropriate power required for operating respective elements and components included in the mobile terminal 100. The power supply unit 190 may include a battery, which is typically rechargeable or be detachably coupled to the terminal body for charging.

The power supply unit 190 may include a connection port. The connection port may be configured as one example of the interface unit 160 to which an external charger for supplying power to recharge the battery is electrically connected.

As another example, the power supply unit 190 may be configured to recharge the battery in a wireless manner without use of the connection port. In this example, the power supply unit 190 can receive power, transferred from an external wireless power transmitter, using at least one of an inductive coupling method which is based on magnetic induction or a magnetic resonance coupling method which is based on electromagnetic resonance.

Various embodiments described herein may be implemented in a computer-readable medium, a machine-readable medium, or similar medium using, for example, software, hardware, or any combination thereof.

Referring now to FIGS. 1B and 1C, the mobile terminal 100 is described with reference to a bar-type terminal body. However, the mobile terminal 100 may alternatively be implemented in any of a variety of different configurations. Examples of such configurations include watch-type, clip-type, glasses-type, or as a folder-type, flip-type, slide-type, swing-type, and swivel-type in which two and more bodies are combined with each other in a relatively movable manner, and combinations thereof. Discussion herein will often relate to a particular type of mobile terminal (for example, bar-type, watch-type, glasses-type, and the like). However, such teachings with regard to a particular type of mobile terminal will generally apply to other types of mobile terminals as well.

The mobile terminal 100 will generally include a case (for example, frame, housing, cover, and the like) forming the appearance of the terminal. In this embodiment, the case is formed using a front case 101 and a rear case 102. Various electronic components are incorporated into a space formed between the front case 101 and the rear case 102. At least one middle case may be additionally positioned between the front case 101 and the rear case 102.

The display unit 151 is shown located on the front side of the terminal body to output information. As illustrated, a window 151a of the display unit 151 may be mounted to the front case 101 to form the front surface of the terminal body together with the front case 101.

In some embodiments, electronic components may also be mounted to the rear case 102. Examples of such electronic components include a detachable battery 191, an identification module, a memory card, and the like. Rear cover 103 is shown covering the electronic components, and this cover may be detachably coupled to the rear case 102. Therefore, when the rear cover 103 is detached from the rear case 102, the electronic components mounted to the rear case 102 are externally exposed.

As illustrated, when the rear cover 103 is coupled to the rear case 102, a side surface of the rear case 102 is partially exposed. In some cases, upon the coupling, the rear case 102 may also be completely shielded by the rear cover 103. In some embodiments, the rear cover 103 may include an opening for externally exposing a camera 121b or an audio output module 152b.

The cases 101, 102, 103 may be formed by injection-molding synthetic resin or may be formed of a metal, for example, stainless steel (STS), aluminum (Al), titanium (Ti), or the like.

As an alternative to the example in which the plurality of cases form an inner space for accommodating components, the mobile terminal 100 may be configured such that one case forms the inner space. In this example, a mobile terminal 100 having a uni-body is formed in such a manner that synthetic resin or metal extends from a side surface to a rear surface.

If desired, the mobile terminal 100 may include a waterproofing unit (not shown) for preventing introduction of water into the terminal body. For example, the waterproofing unit may include a waterproofing member which is located between the window 151a and the front case 101, between the front case 101 and the rear case 102, or between the rear case 102 and the rear cover 103, to hermetically seal an inner space when those cases are coupled.

The mobile terminal 100 may be provided with the display unit 151, the first audio output unit 152a, the second audio output unit 152b, the proximity sensor 141, the illumination sensor 142, the optical output unit 154, the first camera 121a, the second camera 121b, the first manipulating unit 123a, the second manipulating unit 123b, the microphone 122, the interface unit 160, and the like.

FIGS. 1B and 1C depict certain components as arranged on the mobile terminal. However, it is to be understood that alternative arrangements are possible and within the teachings of the instant disclosure. Some components may be omitted or rearranged. For example, the first manipulation unit 123a may be located on another surface of the terminal body, and the second audio output module 152b may be located on the side surface of the terminal body.

The display unit 151 outputs information processed in the mobile terminal 100. The display unit 151 may be implemented using one or more suitable display devices. Examples of such suitable display devices include a liquid crystal display (LCD), a thin film transistor-liquid crystal display (TFT-LCD), an organic light emitting diode (OLED), a flexible display, a 3-dimensional (3D) display, an e-ink display, and combinations thereof.

The display unit 151 may be implemented using two display devices, which can implement the same or different display technology. For instance, a plurality of the display units 151 may be arranged on one side, either spaced apart from each other, or these devices may be integrated, or these devices may be arranged on different surfaces.

The display unit 151 may also include a touch sensor which senses a touch input received at the display unit. When a touch is input to the display unit 151, the touch sensor may be configured to sense this touch and the controller 180, for example, may generate a control command or other signal corresponding to the touch. The content which is input in the touching manner may be a text or numerical value, or a menu item which can be indicated or designated in various modes.

The touch sensor may be configured in a form of a film having a touch pattern, disposed between the window 151a and a display on a rear surface of the window 151a, or a metal wire which is patterned directly on the rear surface of the window 151a. Alternatively, the touch sensor may be integrally formed with the display. For example, the touch sensor may be disposed on a substrate of the display or within the display.

The display unit 151 may also form a touch screen together with the touch sensor. Here, the touch screen may serve as the user input unit 123 (see FIG. 1A). Therefore, the touch screen may replace at least some of the functions of the first manipulation unit 123a.

The first audio output module 152a may be implemented in the form of a speaker to output voice audio, alarm sounds, multimedia audio reproduction, and the like.

The window 151a of the display unit 151 will typically include an aperture to permit audio generated by the first audio output module 152a to pass. One alternative is to allow audio to be released along an assembly gap between the structural bodies (for example, a gap between the window 151a and the front case 101). In this case, a hole independently formed to output audio sounds may not be seen or is otherwise hidden in terms of appearance, thereby further simplifying the appearance and manufacturing of the mobile terminal 100.

The optical output module 154 can be configured to output light for indicating an event generation. Examples of such events include a message reception, a call signal reception, a missed call, an alarm, a schedule notice, an email reception, information reception through an application, and the like. When a user has checked a generated event, the controller can control the optical output unit 154 to stop the light output.

The first camera 121a can process image frames such as still or moving images obtained by the image sensor in a capture mode or a video call mode. The processed image frames can then be displayed on the display unit 151 or stored in the memory 170.

The first and second manipulation units 123a and 123b are examples of the user input unit 123, which may be manipulated by a user to provide input to the mobile terminal 100. The first and second manipulation units 123a and 123b may also be commonly referred to as a manipulating portion, and may employ any tactile method that allows the user to perform manipulation such as touch, push, scroll, or the like. The first and second manipulation units 123a and 123b may also employ any non-tactile method that allows the user to perform manipulation such as proximity touch, hovering, or the like.

FIG. 1B illustrates the first manipulation unit 123a as a touch key, but possible alternatives include a mechanical key, a push key, a touch key, and combinations thereof.

Input received at the first and second manipulation units 123a and 123b may be used in various ways. For example, the first manipulation unit 123a may be used by the user to provide an input to a menu, home key, cancel, search, or the like, and the second manipulation unit 123b may be used by the user to provide an input to control a volume level being output from the first or second audio output modules 152a or 152b, to switch to a touch recognition mode of the display unit 151, or the like.

As another example of the user input unit 123, a rear input unit (not shown) may be located on the rear surface of the terminal body. The rear input unit can be manipulated by a user to provide input to the mobile terminal 100. The input may be used in a variety of different ways. For example, the rear input unit may be used by the user to provide an input for power on/off, start, end, scroll, control volume level being output from the first or second audio output modules 152a or 152b, switch to a touch recognition mode of the display unit 151, and the like. The rear input unit may be configured to permit touch input, a push input, or combinations thereof.

The rear input unit may be located to overlap the display unit 151 of the front side in a thickness direction of the terminal body. As one example, the rear input unit may be located on an upper end portion of the rear side of the terminal body such that a user can easily manipulate it using a forefinger when the user grabs the terminal body with one hand. Alternatively, the rear input unit can be positioned at most any location of the rear side of the terminal body.

Embodiments that include the rear input unit may implement some or all of the functionality of the first manipulation unit 123a in the rear input unit. As such, in situations where the first manipulation unit 123a is omitted from the front side, the display unit 151 can have a larger screen.

As a further alternative, the mobile terminal 100 may include a finger scan sensor which scans a user's fingerprint. The controller 180 can then use fingerprint information sensed by the finger scan sensor as part of an authentication procedure. The finger scan sensor may also be installed in the display unit 151 or implemented in the user input unit 123.

The microphone 122 is shown located at an end of the mobile terminal 100, but other locations are possible. If desired, multiple microphones may be implemented, with such an arrangement permitting the receiving of stereo sounds.

The interface unit 160 may serve as a path allowing the mobile terminal 100 to interface with external devices. For example, the interface unit 160 may include one or more of a connection terminal for connecting to another device (for example, an earphone, an external speaker, or the like), a port for near field communication (for example, an Infrared Data Association (IrDA) port, a Bluetooth port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

The second camera 121*b* is shown located at the rear side of the terminal body and includes an image capturing direction that is substantially opposite to the image capturing direction of the first camera unit 121*a*. If desired, second camera 121*a* may alternatively be located at other locations, or made to be moveable, in order to have a different image capturing direction from that which is shown.

The second camera 121*b* can include a plurality of lenses arranged along at least one line. The plurality of lenses may also be arranged in a matrix configuration. The cameras may be referred to as an "array camera." When the second camera 121*b* is implemented as an array camera, images may be captured in various manners using the plurality of lenses and images with better qualities.

As shown in FIG. 1C, a flash 124 is shown adjacent to the second camera 121*b*. When an image of a subject is captured with the camera 121*b*, the flash 124 may illuminate the subject.

As shown in FIG. 1B, the second audio output module 152*b* can be located on the terminal body. The second audio output module 152*b* may implement stereophonic sound functions in conjunction with the first audio output module 152*a*, and may be also used for implementing a speaker phone mode for call communication.

At least one antenna for wireless communication may be located on the terminal body. The antenna may be installed in the terminal body or formed by the case. For example, an antenna which configures a part of the broadcast receiving module 111 may be retractable into the terminal body. Alternatively, an antenna may be formed using a film attached to an inner surface of the rear cover 103, or a case that includes a conductive material.

A power supply unit 190 for supplying power to the mobile terminal 100 may include a battery 191, which is mounted in the terminal body or detachably coupled to an outside of the terminal body. The battery 191 may receive power via a power source cable connected to the interface unit 160. Also, the battery 191 can be recharged in a wireless manner using a wireless charger. Wireless charging may be implemented by magnetic induction or electromagnetic resonance.

The rear cover 103 is shown coupled to the rear case 102 for shielding the battery 191, to prevent separation of the battery 191, and to protect the battery 191 from an external impact or from foreign material. When the battery 191 is detachable from the terminal body, the rear case 103 may be detachably coupled to the rear case 102.

Figure 2:
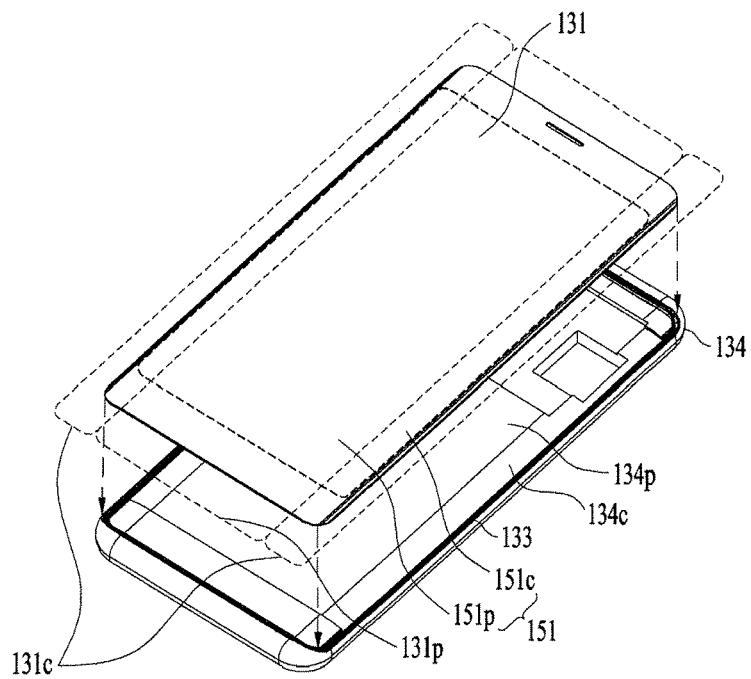
FIG. 2(a) is a perspective diagram of a state before the mobile terminal is coupled and FIG. 2(b) is a perspective diagram of a state after the mobile terminal is coupled.
Figure 2:
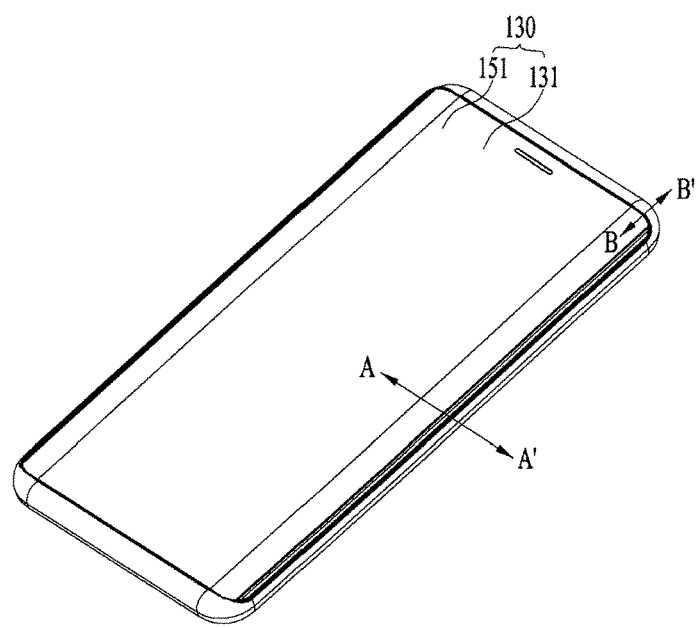

FIG. 2(*a*) is a perspective diagram of a state before the mobile terminal 100 is coupled and FIG. 2(*b*) is a perspective diagram of a state after the mobile terminal 100 is coupled.

A forward direction in which a display unit 141 of the mobile terminal 100 outputs an image is defined as a forward direction and the reverse direction in which the display unit 151 is invisible is defined as a rearward direction.

An exterior design of the mobile terminal 100 may be defined by a frame 134 and a front window 131. A display unit 151 is provided in a rear surface of the front window 131. In other words, the front window 131 is arranged in front of the display unit 151.

The front window 131 is provided in a front surface of the mobile terminal 100 and configured to protect the internal components including the display unit 151. Also, the front window 131 allows the contents output on the display unit 151 to be visible via the front surface of the mobile terminal 100, so that it may be optically transparent.

The front window 131 capable of satisfying the conditions mentioned above may include tempered glass or sapphire glass.

The front window 131 and the display unit 151 may be manufactured as one module unit to minimize the thickness of the mobile terminal 100.

Accordingly, the display unit 151 may be coupled to a rear surface of the front window 131 by a bonding method. An OLED (Organic Light Emitting Diode) type display unit 151 may include a TFT (Thin Film Transistor) panel. A LCD (Liquid Crystal Display) type display unit 151 may include a liquid crystal and a backlight unit.

For explanation convenience, a coupled module of the front window 131 and the display unit 151 is defined as 'a front assembly 130'.

The front assembly 130 is connectedly disposed on the frame 134 and the frame 134 may form an electric control unit, together with the front assembly 130. The frame 134 may means a concept that includes the front case 101 and the rear case 102 and even the rear cover 103.

Meanwhile, the mobile terminal 100 of the present disclosure may be realized as a curved display type.

More specifically, the display unit 151 may include a flat area 151*p* and a curved area 151*c* provided in at least predetermined area adjacent to the flat area 151*p*. In the embodiments of the present disclosure, the flat area 151*p* is provided in a central area and the curved area 151*c* is provided in left and right end areas.

For explanation convenience, the flat area 151*p* of the display unit 151 is defined as a first flat area 151*p* and the curved area 151*c* as a first curved area 151*c*.

The front window 131 and the frame 134 may have a corresponding shape to the shape of the display unit 151 having the curved area 151*c*.

The flat area 131*p* of the front window 131 corresponding to the display unit 151 is defined as a second flat area 131*p* and the curved area 131*c* is defined as a second curved area 131*c*. The flat area 134*p* of the frame 134 is defined as a third flat area 134*p* and the curved area as a third curved area 134*c*.

The shapes of the front window 131 and the frame 134 are corresponding to the shape of the display unit 151 so that they may be similar. The similar shapes may mean that the facing surfaces with the same curvature can lie upon another surface to surface. Accordingly, the second flat area 131*p* and the third flat surface are overlapped with the first flat area 151*p*. The second curved area 131*c* and the third curved area 134*c* are overlapped with the first curved area 151*c*.

In other words, the front window 131 also include the second curved area 151*c* adjacent to the second flat area 151*c* and the frame 134 also includes the third curved area 134*c* adjacent to the third flat area 134*p*, corresponding to the display unit 151.

The overlapped first, second and third flat areas 151*p*, 131*p* and 134*p* may have the same width in a horizontal (right-and-left) direction. The first, second and third areas 151*c*, 131*c* and 134*c* may have the same width in the horizontal (right-and-left) direction.

In this instance, it is not the required condition that the overall areas mentioned above lie one upon another but at least predetermined areas may be overlapped. The word of 'lying one upon another' may mean that the overlapped areas have the same curvature.

Each predetermined area of the second and third curved areas 131c and 134c may be overlapped with the first curved area 151c.

Figure 3:
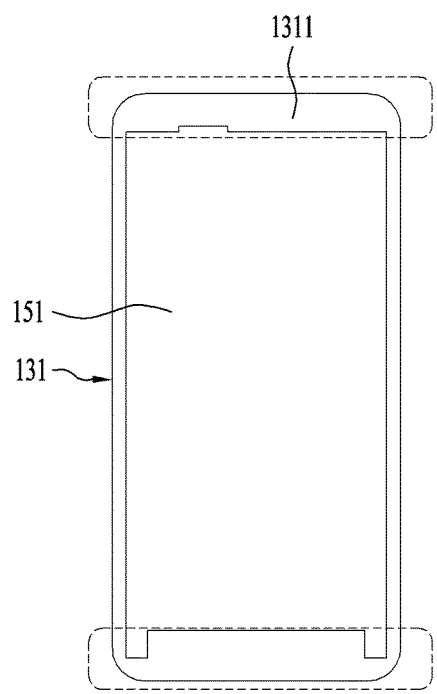
FIG. 3(a) is a rear view of a front assembly in accordance with the present disclosure and FIG. 3(b) illustrates a virtual area having an adhesive member and a waterproof member provided in a rear surface of a front assembly.
Figure 3:
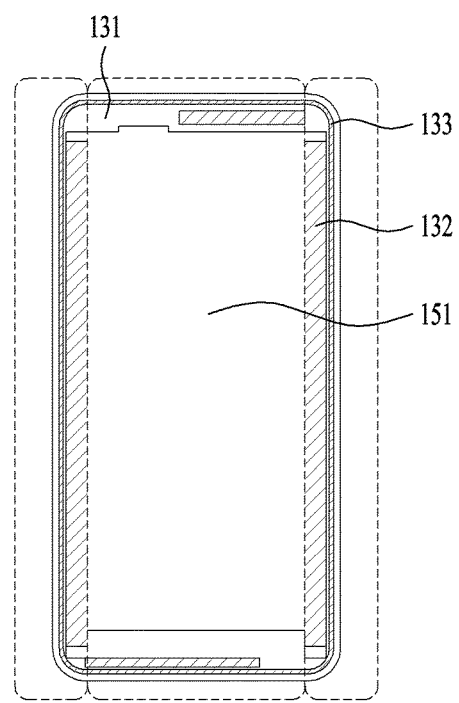

FIG. 3(a) is a rear view of the front assembly 130 in accordance with the present disclosure and FIG. 3(b) illustrates a virtual area having an adhesive member 132 and a waterproof member 133 provided in a rear surface of the front assembly 130.

Seen in front or behind, the area of the display unit 151 may belong to the area occupied by the front window 131. The display unit 151 is expanded closer to a left end and a right end of the front window 131. A non-display area 1311 having no display unit 151 may be provided in an upper end and a lower end.

The front assembly 130 is coupled to the frame 134, which may be realized by an adhesive member 132 provided between a rear surface of the front assembly 130 and a front surface of the frame 134.

It is preferred that the adhesive member 132 is provided in an outermost area of the rear surface of the front assembly 130 so as to minimize a coupling gap between the front assembly 130 and the frame 134.

Accordingly, the adhesive member 132 is provided in the rear surface of the display unit 151 in the right and left area of the front assembly 130 and the rear surface of the front window 131 in the upper and lower area of the front assembly 130.

Meanwhile, a waterproof 133 is provided to realize waterproof for a boundary area of the coupling between the front window 131 and the frame 134.

It is common that a conventional waterproof tape functions as the adhesive member 132 and the waterproof member 133 at the same time. More specifically, the waterproof tape is provided along a rim of the rear surface of the front assembly 130 and the front assembly 130 having the waterproof tape is bonded to the frame 134.

However, some of the waterproof tape has to be provided in the rear surface of the display unit 151 and the other one has to be provided in the rear surface of the front window 131, similar to the adhesive member 132, and the waterproof tape may be provided in different layers in the forward and rearward directions of the mobile terminal 100, respectively, so that it can inevitably have a curve or step. To realize the perfect waterproof structure, an auxiliary structure has to be provided disadvantageously.

The embodiments of the present disclosure provide a separated structure between the adhesive member 132 and the waterproof member 133 to solve the disadvantage.

The waterproof member 133 may be provided along an outermost rime of the rear surface of the front window 131, while forming a looped curve. The adhesive member 132 may be provided inner portion of the waterproof member 133 in the rear surface of the front window 131.

The adhesive member 132 is provided between the front window 131 and the frame 134 with respect to the upper and lower areas which are the flat area 130p of the front assembly 130. The adhesive member 132 is provided between the display unit 151 and the frame 134 with respect to the right and left area which are the curved area 130c.

At this time, the function of the waterproof member 133 is separated from that of the adhesive member 132, so that the adhesive member 132 may be selectively provided only in a necessary area, while need not forming the looped curve.

Figure 4:
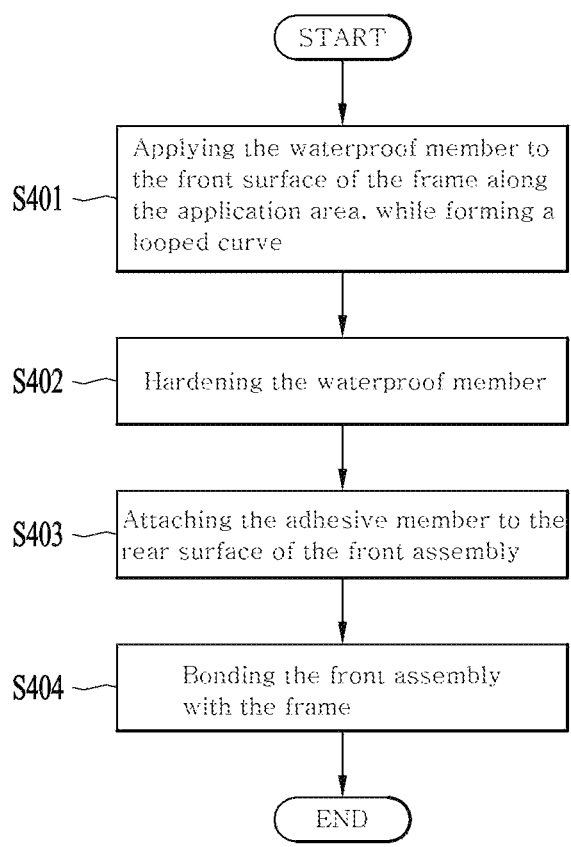
FIG. 4 is a flow chart illustrating a method for manufacturing the mobile terminal in accordance with one embodiment.

FIG. 4 is a flow chart illustrating a method for manufacturing the mobile terminal 100 in accordance with one embodiment.

The waterproof member 133 is applied to the front surface of the frame 134 along an application area 1342, while forming the looped curve (S401). As a preset time period passes after the application, the waterproof member 133 is hardened (S402). Hence, the adhesive member 132 is attached to the rear surface of the front assembly 130 (S403). Then, the adhesive member 132 attached to the rear surface of the front assembly 130 is bonded to a display mounting area 1341 of the frame 134 (S404).

As occasion occurs, the attaching step (S403) of the adhesive member 132 may be performed before the application step of the waterproof member 133.

The manufacturing method will be described in detail, referring to FIGS. 5 through 14.

Figure 5A:
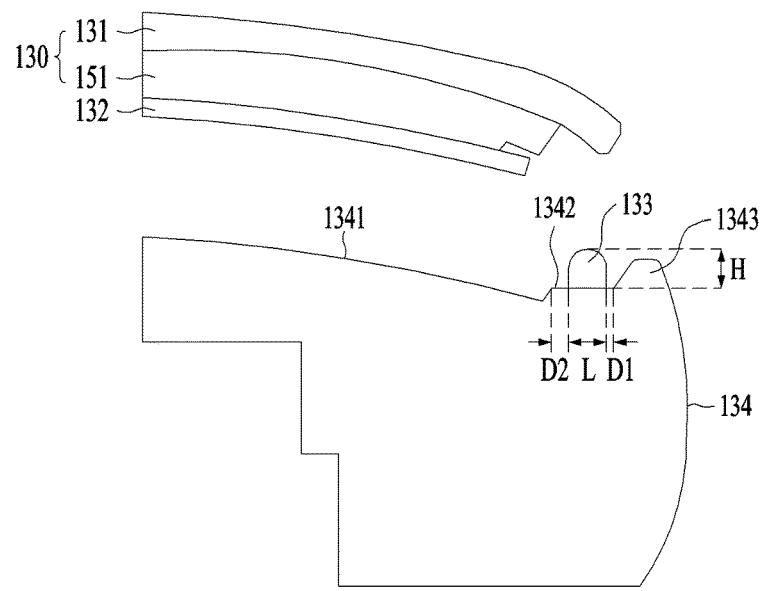
FIG. 5(a) is a sectional diagram along A-A' of FIG. 2(a) and FIG. 5(b) is a sectional diagram along A-A' of FIG. 2(b)
Figure 5B:
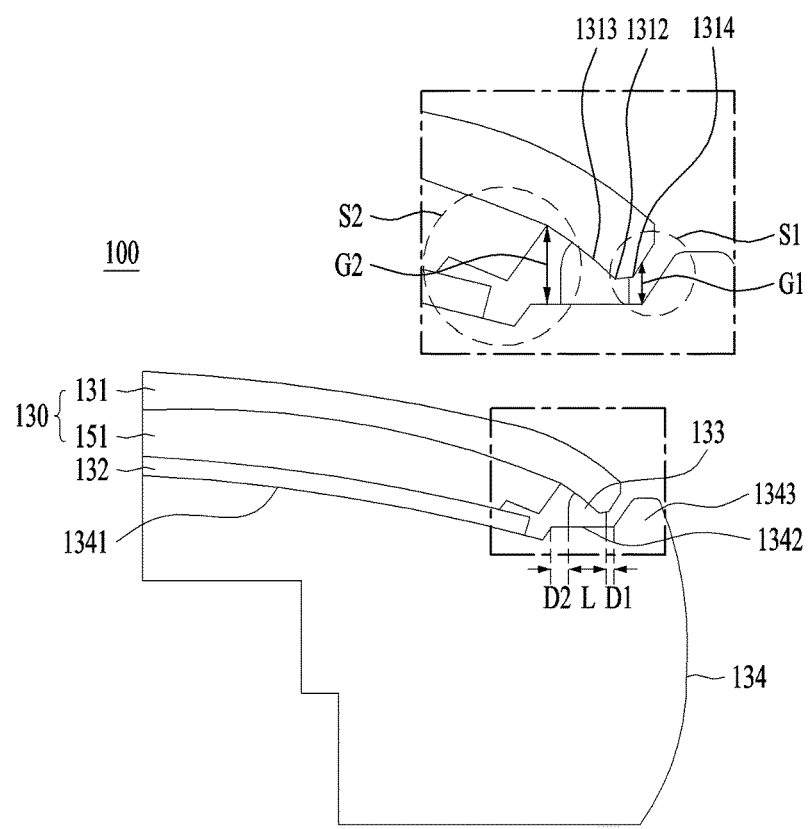

FIG. 5(a) is a sectional diagram along A-A' of FIG. 2(a) and FIG. 5(b) is a sectional diagram along A-A' of FIG. 2(b).

In the third curved area 134c of the frame 134, one area of the front surface of the frame where the display unit 151 is mounted may be defined as a display mounting area 1341 and another area of the frame front surface adjacent to the display mounting area 1341 where the waterproof member 133 is applied may be defined as an application area 1342.

The application area 1342 may be provided in a side wall 1343 of the outermost area of the frame 134 and form a step recessed relatively rearward with respect to the side wall 1343.

Figure 6:
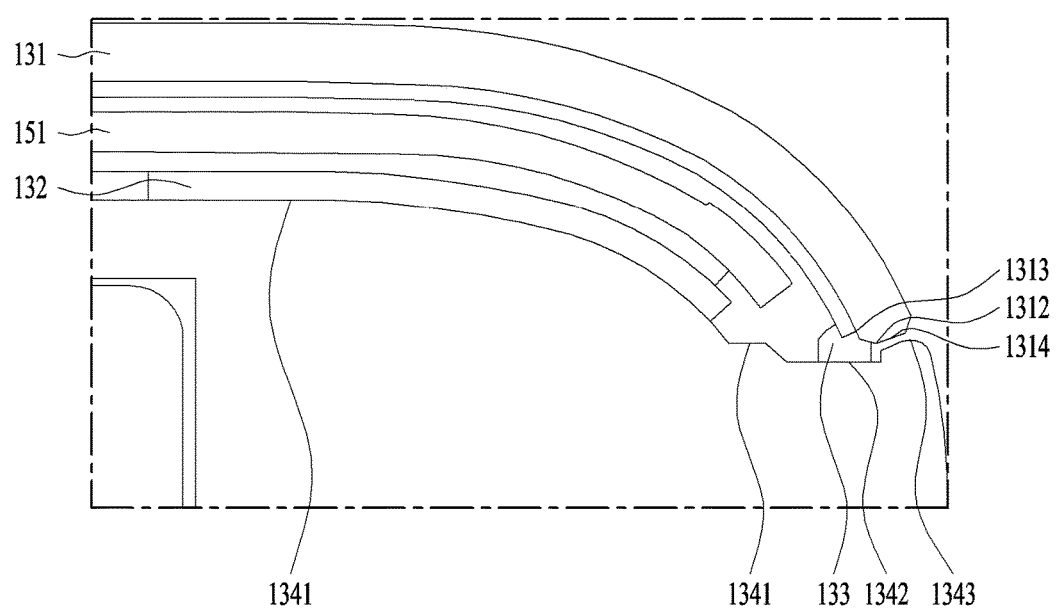
FIG. 6 is another example of the sectional diagram along A-A' of FIG. 2(b)

As shown in FIG. 6, the application area 1342 may also form a groove which is recessed relatively rearward with respect to the display mounting area 1341 as well as the side wall 1343.

The waterproof member 133 is applied to the front surface of the frame 134 along the application area 1342, while forming the looped curve (S401).

When the waterproof member 133 is applied to the application area 1342, the application area having the groove shape allows the waterproof member 133 to be hardened without flowing outside or inside and supported by the side wall 1343 without being pushed outside even in the coupling process to the front assembly 130.

Accordingly, at least some area of the curved area of the waterproof member 133 may be arranged between an outer end of the second curved area 131c of the front window 131 and an outer end of the third curved area 134c of the frame 134.

The waterproof member 133 becomes a gel before being hardened. In other words, the waterproof member 133 is very viscous, not a liquid which is deformed in various shapes according to a container thereof. The state of the waterproof member 133 is easily deformed even by a weak external shock, not restored into the original state. In such a gel state, the waterproof member 133 is easy to apply to a specific area.

However, when become hardened, the waterproof member 133 will go to a solid having a predetermined elasticity. At this time, the waterproof member 133 has the elasticity and is able to restitute even after it is deformed by the weak external shock. Such the waterproof member 133 may include silicon resin and other diverse materials.

After applied to the front surface of the frame 134, the waterproof member 133 becomes hardened (S402). As it will be described later, the front assembly 130 is coupled to the front surface of the frame 134. At this time, it is preferred that the waterproof member 133 is hardened to be in the solid state having elasticity before the front assembly 130 is coupled. Meanwhile, different from the conventional waterproof tape, the waterproof member 133 is applied to a wide area thin and it takes much time to harden the waterproof member. Accordingly, the manufacturing time can be reduced and the waterproof structure may become simple enough to reduce the manufacturing cost. By experiments, the applied waterproof member 133 may have the width (L) of approximately 0.6 mm and the height (H) of approximately 0.5 mm.

No nozzle for applying the waterproof member 133 has to be provided in the frame 134 so that it may be easy to apply the waterproof member 133 in case the case of the mobile terminal 100 is formed as a uni-body.

When edges of the front assembly 130 applies a predetermined pressure to the hardened waterproof member 133 by contact, the waterproof member 133 is deformed, corresponding to the shape of the edge of the front assembly 130. The waterproof member 133 closely contacts with the edges of the front assembly 130 and the space formed between the front assembly 130 and the frame 134 may be closed airtight to prevent the permeating of the water and other foreign substances.

Meanwhile, when the waterproof member 133 is applied to the front surface of the application area 1342, a distance (D1) from the waterproof member 133 to an outer end of the application area 1342 may be narrower than a distance (D2) from the waterproof member 133 to an inner end of the application area 1342. By experiments, the distance (D1) from the waterproof member 133 to the outer end of the application area 1342 may be approximately 0.1 mm and the distance (D2) from the waterproof member 133 to the inner end of the application area 1342 may be approximately 0.3 mm.

That is to deform the waterproof member 133 toward the inside of the frame 134 as shown in FIG. 5(a), when the waterproof member 133 is deformed by the pressure of the edges of the front assembly 130. If the waterproof member 133 is deformed toward the outside of the frame 134, the waterproof member 133 is exposed outside the mobile terminal 100 only to deteriorate the exterior design of the mobile terminal 100. The waterproof member 133 might be deformed further by the other external shock not applied by the edges. In this instance, some gap could be formed between the front assembly 130 and the waterproof member 133 and it is more likely to facilitate the permeating of the water and other foreign substances. Accordingly, the waterproof member 133 may be deformed toward the inside of the frame 134 not to be exposed outside the mobile terminal 100 so that the user may be provided with the beautiful exterior design and the waterproof member 133 may be prevented from being further deformed by other external shocks.

For the same purpose, the inner space of the curved area may be formed with a spare. When the waterproof member 133 divides a space formed between the front window 131 and the frame 134 into a closed space (S2) and an outer space (S1), the closed space (S2) may be larger than the outer space (S1) for the waterproof member 133 even in case of being pressed to be pushed into the closed space (S2).

A back-and-forth distance between the front window 131 and the frame 132 of the closed space (S2) may be larger than a back-and-forth gap between the front window 131 and the frame 134 of the outer space (S1).

When the waterproof member 133 is divided into an inner surface and an outer surface, it is preferred that the rear edge 1312 of the front window 131 is designed to press the outer surface of the waterproof member 133 for the hardened waterproof member 131 to be pushed inwards in case the front assembly 130 is seated. Moreover, when the rear edge 1312 contacts with the waterproof member 133, the inner area 1313 and the outer area 1314 adjacent to the rear edge 1312 are in contact with the waterproof member 133 by the pressure and then the contact surface may be complexly bending enough to enhance the waterproof function.

FIG. 6 is another example of the sectional diagram along A-A' of FIG. 2(b).

The embodiment of FIG. 5 shows that the side wall 1343, the application area 1342 and the display mounting area 1341 are formed in a step shape. However, the illustrated embodiment of FIG. 6 shows that the application area 1342 is formed in a groove between the side wall 1343 and the display mounting area 1341. As mentioned above, the application and hardening of the waterproof member 133 may be performed stably in case the application area 1342 forms a groove.

The shape of the display mounting area 1341 may be dependent on the shape of the display unit 151. Accordingly, the application area 1342 is likely to become unnecessarily wide. If the application area 1342 becomes unnecessarily wide, the function of guiding the application and hardening of the waterproof member 133 cannot be performed efficiently. A projected end 1344 may be provided between the display mounting area 1341 and the application area 1342 to prevent the application area 1342 from becoming too wide so that the width of the groove shape can be kept to a preset value or less.

The characteristics not mentioned in the embodiment of FIG. 6 may be equal to those of the frame 134 and the front assembly 130 mentioned in the embodiment of FIG. 5.

Figure 7:
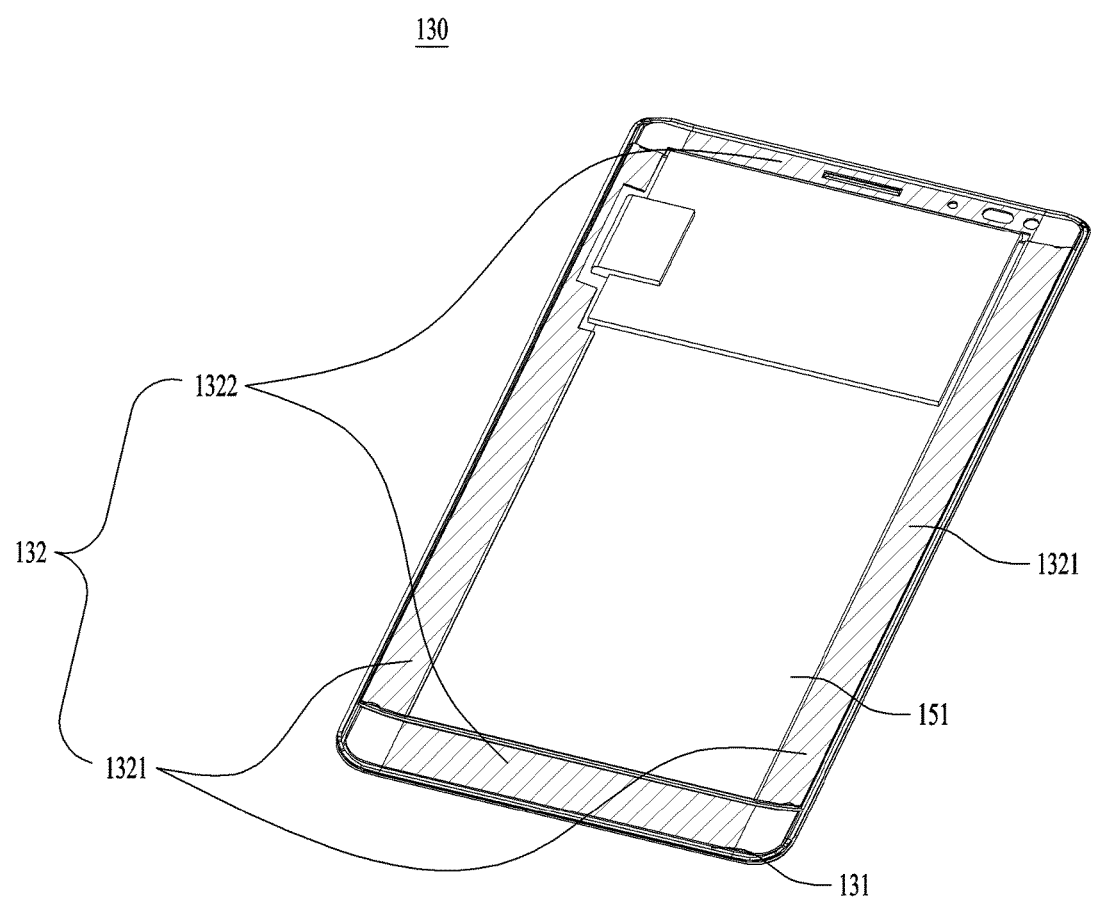
FIG. 7 is a rear perspective diagram of a front assembly having one embodiment of an adhesive member 132 attached thereto.
Figure 8:
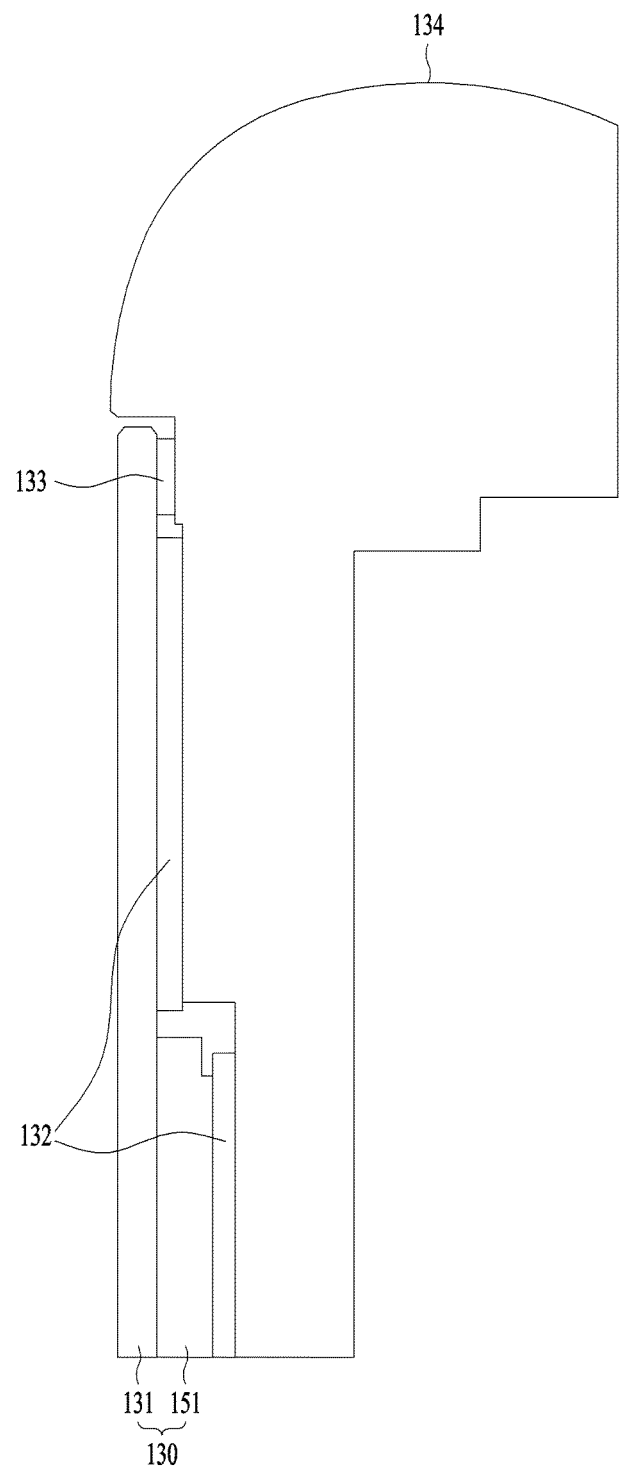
FIG. 8 is a sectional diagram along b-B' of FIG. 2(b)

FIG. 7 is a rear perspective diagram of the front assembly 130 having one embodiment of an adhesive member 132 attached thereto and FIG. 8 is a sectional diagram along b-B' of FIG. 2(b).

The adhesive member 132 is attached to the rear surface of the front assembly 130 (S403). It is preferred that the adhesive member 132 is attached closer to an outer edge of the front assembly 130 and that is on the condition that the adhesive member 132 is provided in the waterproof member 133 as mentioned above.

The adhesive member 132 may include one adhesive member 1321 attached to a lateral area of the front assembly 130 and the other adhesive member 1322 attached to upper and lower areas of the front assembly 130, which are attached to different layers and separated from each other to form a step. In this instance, the adhesive member is provided as a different member from the waterproof member 133 so that it may not affect the waterproof function. In addition, such the adhesive member is able to reduce the thickness and overall area of the waterproof member, compared with the conventional waterproof member, and the manufacturing cost may be reduced.

The adhesive member 132 may include a fixing tape and the fixing tape may be made of a material which is unrelated with the waterproof function based on the reasons mentioned above.

The adhesive member 132 attached to the rear surface of the front assembly 130 is bonded and coupled to the display mounting area 1341 provided in the front surface of the frame 134 (S4040).

The separated structure between the waterproof member 133 and the adhesive member 132 may facilitate the easy decoupling between front assembly 130 and the frame 134.

For example, it happens that the front window 131 or the display unit 151 of the front assembly 130 has to be replaced by a malfunction or an error generated in the manufacturing process. In this instance, the user is able to decouple the front assembly 130 from the frame 134 when detaching only the adhesive member 132 in the embodiment of the present disclosure.

Even when the front assembly 130 is decoupled from the frame 134, the waterproof member 133 is already hardened and able to be restored to the former original shape before deformation. If the front assembly 130 is coupled to the frame 134 again after fixing the error or a new one replaces the former one, the waterproof member 133 is deformed corresponding to the shape of the edge of the front assembly 130 and the waterproof function may not be lost. Accordingly, the disadvantage of the conventional case which has to be replaced to cause the high maintenance cost may be prevented.

Figure 9:
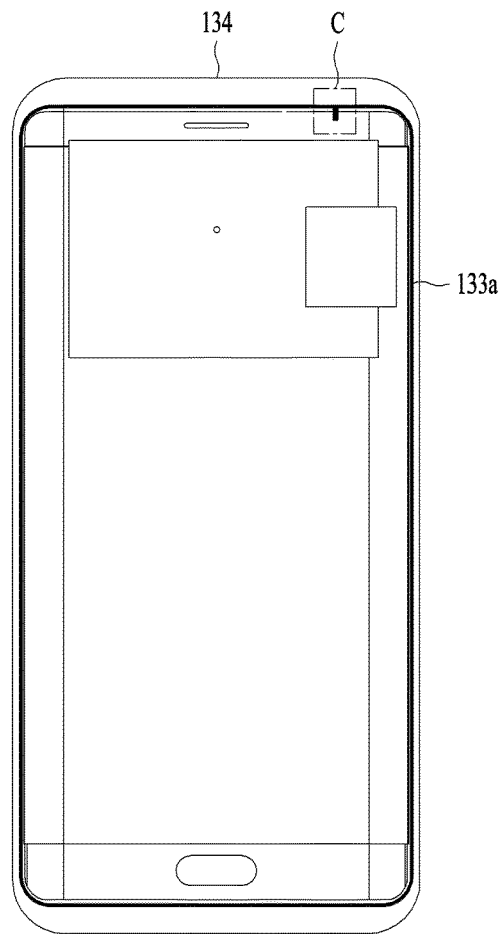
FIG. 9 is a front view illustrating a frame to which a waterproof member is applied by an application method in accordance with one embodiment of the present disclosure.
Figure 10:
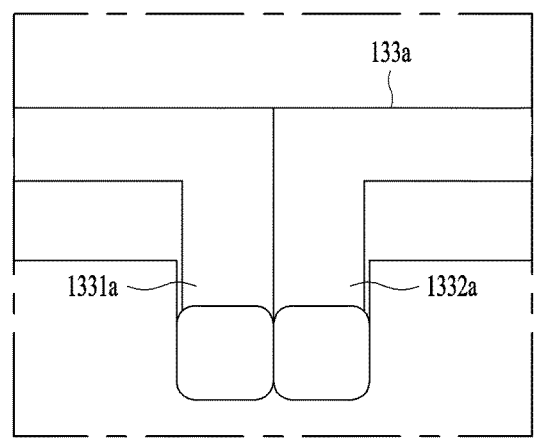
FIG. 10 is an enlarged front perspective diagram of 'C' area showing a start portion and an end portion of the waterproof member shown in FIG. 9 in detail.

FIG. 9 is a front view illustrating the frame 134 to which the waterproof member 133a is applied by an application method in accordance with one embodiment of the present disclosure. FIG. 10 is an enlarged front perspective diagram of 'C' area showing a start portion 1331a and an end portion 1332a of the waterproof member 133a shown in FIG. 9 in detail. For convenient explanation, FIGS. 9 and 10 are referred to.

As mentioned above, the waterproof member 133a is applied to the front surface of the application area 1342, while forming the looped curve. To form the looped curve of the waterproof member 133a, a nozzle injects the waterproof member 133a at a specific point of the frame 134 initially and then moves along the edge of the display mounting area 1341 of the front assembly at a preset speed. Hence, the nozzle is injecting a preset amount of the waterproof member 133a consistently. Accordingly, the start portion 1331a and the end portion 1332a of the waterproof member 133a may be in contact with each other.

As shown in FIGS. 9 and 10 illustrating the embodiment, the start portion 1331a and the end portion 1332a of the waterproof member 133a are located in an inner portion of the frame, compared with the application area 1342, in contact with each other in parallel. Especially, as shown in FIG. 10, the start portion 1331a and the end portion 1332a may be extended toward the portion of the application area 1342 side by side. After reaching the application area 1342, the end portion 1331a and the end portion 1332a are perpendicularly bent in the reverse directions and extended, respectively.

To apply the waterproof member 133a as mentioned above, the nozzle starts to inject the waterproof member 133a from an inner area, not the edge area of the mounting area 1341 of the front assembly. In this instance, the inner area is closer to the edge of the mounting area 1341 of the front assembly than the central area. While injecting the waterproof member 133a toward a specific portion of the application area 1342 at a preset speed, the nozzle is moving at a preset speed and then the start portion 1331a of the waterproof member 133a is applied. When it reaches an upper area of the application area 1342, the nozzle changes the moving direction into a left or right direction perpendicularly and moves along the edge of the mounting area 1341 of the front assembly. After reaching the application area 1342, the waterproof member 133a is perpendicularly bent and applied to the front surface of the application area 1342 along the edge of the mounting area 1341 of the front assembly.

Once the entire waterproof member 133a is applied along the edge of the mounting area 1341 of the front assembly, the nozzle reaches near the reached upper portion of the application area 1342 again. After that, the nozzle perpendicularly changes the moving direction into a left or right direction, in other words, a direction toward the more inner portion than the edge of the mounting area 1341. The nozzle starts to inject the waterproof member 133a to contact with the start portion 1331a in parallel. Accordingly, the end portion 1332a of the waterproof member 133a is applied and the waterproof member 133a forms the looped curve.

If the nozzle changes the moving direction to the left, the nozzle moves in a counter-clockwise direction. When the nozzle changes the moving direction to the right, the nozzle moves in a clockwise direction. In FIG. 10, the start portion 1331a is located to the left to the end portion 1332a and it can be said that the nozzle changed the moving direction to the left so that it moved in the counter-clockwise direction. However, the embodiments of the present disclosure are not limited thereto and the nozzle changes the moving direction to the right to move in the clockwise direction. In this instance, the start portion 131a may be located in the right, compared with the end portion 1332a.

Figure 11:
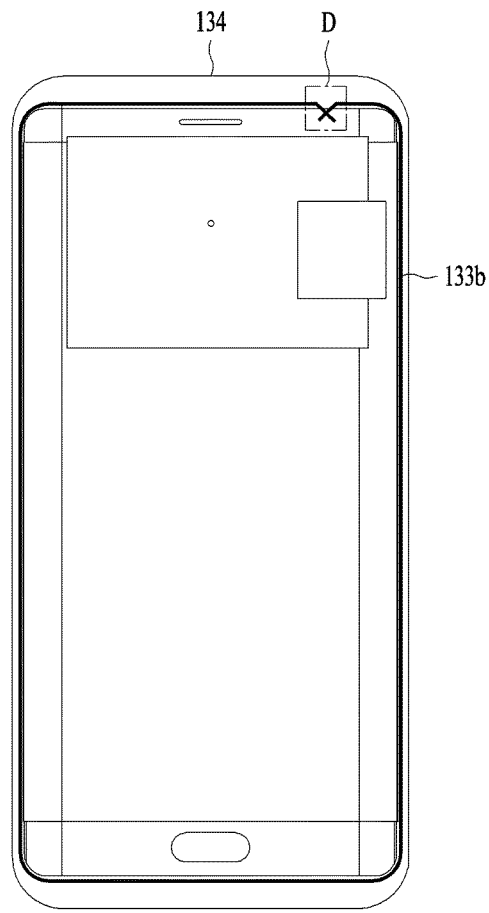
FIG. 11 is a front view illustrating a frame to which a waterproof member is applied by an application method in accordance with another embodiment of the present disclosure.
Figure 12:
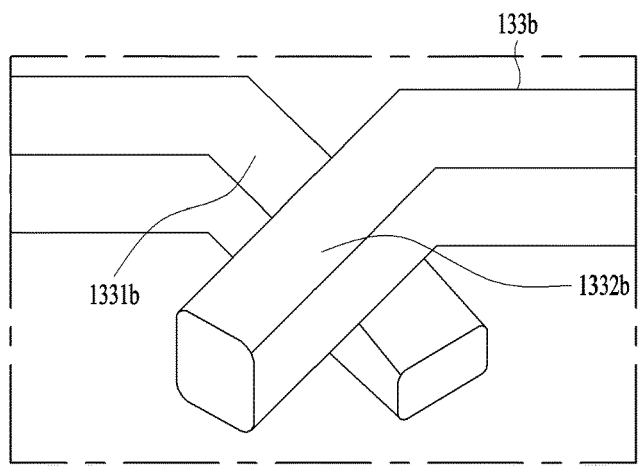
FIG. 12 is an enlarged front perspective diagram of 'D' area showing a start portion and an end portion of the waterproof member shown in FIG. 11 in detail.

FIG. 11 is a front view illustrating the frame 134 to which a waterproof member 133b is applied by an application method in accordance with another embodiment of the present disclosure. FIG. 12 is an enlarged front perspective diagram of 'D' area showing a start portion 1331b and an end portion 1332b of the waterproof member 133b shown in FIG. 11 in detail. For explanation convenience, FIGS. 11 and 12 are referred together.

As shown in FIGS. 11 and 12 illustrating the embodiment, the start portion 1331b and the end portion 1332b of the waterproof member 133b are located in an inner portion of the frame 134, compared with the application area 1342, and they cross and contact with each other. especially, as shown in FIG. 12, the start portion 1331b and the end portion 1332b are extended toward different portions of the application area 1342, respectively, in a state of being inclined a preset angle with respect to the edge of the mounting area 1341 of the front assembly to cross each other. After reaching the application area 1342, the start portion 1331b and the end portion 1332b are bent in the reverse directions, respectively, and extended after that.

The repeated description of the waterproof member 133b in accordance with the illustrated embodiment is omitted with respect to the waterproof member 133a in accordance with the former embodiment mentioned above. The repeated description is omitted because it can be easily embodied by those skilled in the art, not to limit the embodiments of the present disclosure.

To apply the waterproof member 133b as mentioned above, the nozzle starts to inject the waterproof member 133b in an inner portion, compared with the edge of the mounting area 1341 of the front assembly. Hence, the nozzle moves along a path which is inclined a preset angle with respect to the edge of the mounting area 1341 toward a specific portion of the application area 1342. Accordingly, the start portion 1331b of the waterproof 133b is applied. Once reaching an upper portion of the application area 1342, the nozzle changes the moving direction into a left or right direction and then moves along the edge of the mounting area 1341 at a preset speed. Hence, the waterproof member 133b is bent at a specific angle after reaching the application area 1342 and applied to the front surface of the application area 1342 along the edge of the mounting area 1341 of the front assembly.

Once the entire waterproof member 133b is applied along the edge of the mounting area 1341 of the front assembly, the nozzle reaches near the upper portion of the application area 1342 again. After that, the nozzle changes the moving direction into a left or right direction, in other words, a direction toward the more inner portion than the edge of the mounting area 1341. The nozzle starts to inject the waterproof member 133a to cross and contact with the start portion 1331a. Accordingly, the end portion 1332a of the waterproof member 133a is applied and the waterproof member 133a forms the looped curve.

As shown in FIG. 12, the thickness of the start portion 1331 when applied initially may be different from that of the start portion once reaching the application area 1342. In other words, to prevent the gap formed between the frame 134 and the waterproof member 133 by the start portion 1331b and the end portion 1332b crossing each other, the thickness of the start portion 1331e when applied initially may be smaller than the thickness of the start portion 1331b when reaching the application area 1342. When the front assembly 130 is coupled to the frame 134, the space between the front assembly 130 and the frame 134 may be closed completely.

Figure 13:
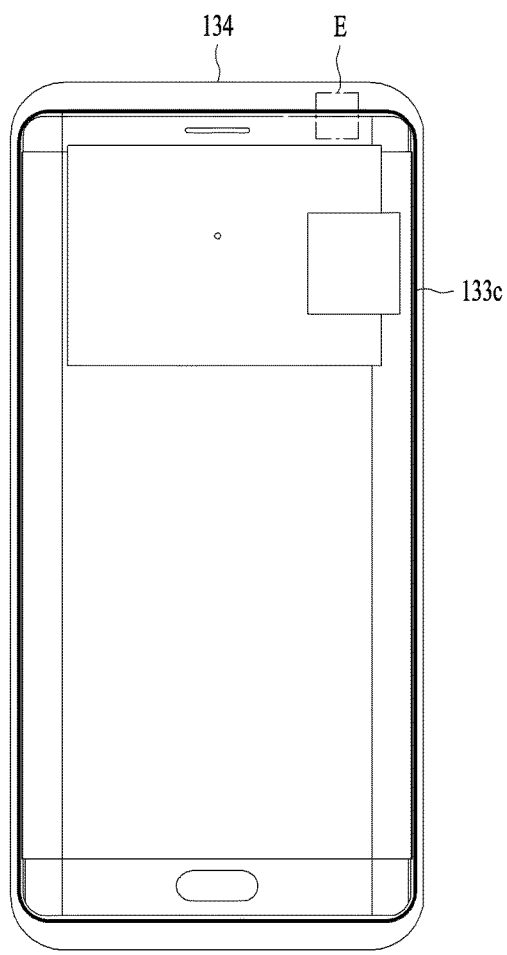
FIG. 13 is a front view of a frame to which the waterproof member is applied by a wrong method.
Figure 14:
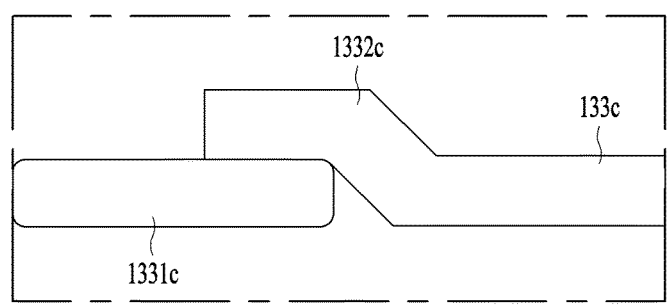
FIG. 14 is an enlarged side view of 'E' area showing a start portion and an end portion of the waterproof member shown in FIG. 13 in detail.

FIG. 13 is a front view of the frame 134 to which the waterproof member 133c is applied by a wrong method and FIG. 14 is an enlarged side view of 'E' area showing the start portion 1331c and the end portion 1332c of the waterproof member 133c shown in FIG. 13 in detail.

To improve the waterproof function by applying the waterproof member 133c, it is preferred that the waterproof member 133c is applied by the application method in accordance with one or the other embodiment of the present disclosure. However, as shown in FIGS. 13 and 14, it is a wrong method that the start portion 1331c and the end portion 1332c of the waterproof member 133c contact with each other to be layered. If the start portion 1331c and the end portion 1332c are multilayered, a gap might be generated between the frame 134 and the end portion 1332c of the waterproof member 133. If such a gap is generated, water or other foreign substances might permeate via the gap and the waterproof function of the waterproof member 133c could not be performed.

According to the application method of the other embodiment mentioned above, it is more likely to generate the gap when the end portion 1332c is disposed on the start portion 1331c even with the thin start portion 1331c when applied initially. Accordingly, that method might cause the increase of the error rate.

Such the wrong method occurs when the nozzle starts to inject the waterproof member 133 when located beyond the application area 1342. Accordingly, it is preferred that the nozzle starts to inject the waterproof member 133 when located in the inner portion, not in the edge of the mounting area 1341 by the application method in accordance with the one embodiment or the other embodiment.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds, are therefore intended to be embraced by the appended claims.

What is claimed is:

1. A mobile terminal comprising:
a display unit comprising a first flat area and a first curved area provided adjacent to at least predetermined portion of the first flat area;
a front window arranged in front of the display unit and comprising a second flat area and a second curved area provided adjacent to at least predetermined portion of the second flat area;
a frame arranged behind the display unit and comprising a third flat area with the same right-and-left width to the first flat area and a third curved area provided adjacent to at least predetermined portion of the third flat area;
an adhesive member arranged between the first flat area and the third flat area and configured to bondingly couple the display unit and the frame to each other; and
a waterproof member provided on an outer portion of the adhesive member and configured to form a closed space between the front window and the frame by forming a looped curve between an edge of the front window and an edge of the frame,
wherein at least predetermined portion of each of the second and third curved areas is overlapped with the first curved area, and
at least predetermined portion of the waterproof member is provided between an outer end of the second curved area and an outer end of the third curved area, and
the waterproof member divides a space formed between the front window and the frame into the closed space and an outer space, and a back-and-forth gap between the front window and the frame of the closed space is larger than a back-and-forth gap between the front window and the frame of the outer space.

2. The mobile terminal of claim 1, wherein the third curved area comprises,
a side wall projected from an outermost portion; and
an application area provided in an inner portion of the side wall and having a step recessed backwards with respect to the side wall, and
the waterproof member is provided in an outer portion of the application area.

3. The mobile terminal of claim 1, wherein an edge of a rear surface of the front window contacts with an outer surface of the waterproof member.

4. The mobile terminal of claim 1, wherein the waterproof member comprises,
a start portion bent from one portion of the looped curve; and
an end portion bent at the other opposite portion of the looped curve and forming a boundary with the start portion, and
the start portion and the end portion are provided to contact in parallel and forms the boundary.

5. The mobile terminal of claim 4, wherein the start portion and the end portion are bent toward the inside of the waterproof member.

6. The mobile terminal of claim 1, wherein the waterproof member comprises,
a start portion bend from one portion of the looped curve; and
an end portion bent at the other opposite portion of the looped curve and forming a boundary with the start portion, and
the start portion and the end portion are provided to cross each other and forms the boundary.

7. The mobile terminal of claim 6, wherein the start portion and the end portion are bent toward the inside of the waterproof member.

8. The mobile terminal of claim 1, wherein the waterproof member comprises,
   a start portion bend from one portion of the looped curve; and
   an end portion bent at the other opposite portion of the looped curve and forming a boundary with the start portion, and
   the start portion and the end portion are provided thinner than the other portions of the waterproof.

9. The mobile terminal of claim 8, wherein the start portion and the end portion are bent toward the inside of the waterproof member.

* * * * *